United States Patent [19]

Lewis

[11] Patent Number: 5,139,928
[45] Date of Patent: Aug. 18, 1992

[54] IMAGEABLE RECORDING FILMS

[75] Inventor: David F. Lewis, Monroe, Conn.

[73] Assignee: ISP Investments Inc., Wilmington, Del.

[21] Appl. No.: 601,546

[22] Filed: Oct. 23, 1990

[51] Int. Cl.$^5$ .......................... G03C 1/00; G03C 1/72
[52] U.S. Cl. ................................. 430/346; 430/270; 430/281; 430/286; 430/495; 430/502; 430/945
[58] Field of Search .............. 430/286, 288, 346, 281, 430/270, 945, 271, 273, 332, 333, 502, 495; 526/285

[56] References Cited

U.S. PATENT DOCUMENTS

| | | | |
|---|---|---|---|
| 3,723,121 | 3/1973 | Hauser | 430/20 |
| 4,215,208 | 7/1980 | Yee et al. | 526/285 |
| 4,297,470 | 10/1981 | Osada et al. | 526/304 |
| 4,389,217 | 6/1983 | Baughman et al. | 436/2 |
| 4,536,473 | 8/1985 | Mihara | 430/575 |
| 4,649,100 | 3/1987 | Leyrer | 430/326 |
| 4,678,736 | 7/1987 | Hanamura et al. | 430/270 |
| 4,684,688 | 8/1987 | Moskowitz | 524/336 |
| 4,705,742 | 11/1987 | Lewis | 430/333 |
| 4,753,861 | 6/1988 | Tsou et al. | 430/19 |
| 4,957,851 | 9/1990 | Tomida et al. | 430/272 |
| 5,004,671 | 4/1991 | Nishimura et al. | 430/286 |
| 5,049,428 | 9/1991 | Kanno et al. | 428/64 |

Primary Examiner—Charles L. Bowers, Jr.
Assistant Examiner—John A. McPherson
Attorney, Agent, or Firm—Marilyn J. Maue; Joshua J. Ward

[57] ABSTRACT

The invention relates to the exposure of a recording film to an image transmitting device and to a thermochromic polyacetylenic recording film comprising, as an imageable medium, a supported, imageable crystalline polyacetylene monomer layer in contact with an imageable polyacetylene polymer in a mole ratio of between about 1:1 and about 1000:1 which medium additionally can contain an energy absorbing, heat transferring agent having an optical absorbance at a wavelength similar to that of the image transmitting device.

19 Claims, No Drawings

IMAGEABLE RECORDING FILMS

In one aspect the invention relates to a recording film having a thermochromic imageable medium which is thermally imageable by exposure to a source of energy transmitted at a wavelength of from about 400 nm to about 1,500 nm.

In another aspect the invention relates to the process of imaging said medium and to a system for detection of image transmission on said film from a recording device.

BACKGROUND OF THE INVENTION

Diacetylenic and other non-polymeric polyacetylenic compounds have been used as recording layers for optical discs and similar information storage devices. However, the development of a visual image requires exposure at short wavelengths, which excludes more economical and efficient laser imaging, since the polyacetylene compounds are generally incapable of absorbing energy and undergoing polymerization when exposed to light in the region above about 400 nm. Visual images are those images which are clearly recognizable by the human eye and are characterized by high optical contrast in one or more of the red, green and blue portions of the spectrum. By high optical contrast is meant an optical density difference of at least 1.0 between the maximum density and minimum density portions of the image, where optical density is defined as $\log_{10}(1/\text{transmittance})$ for transmitted light and $\log_{10}(1/\text{reflectance})$ for reflected light. Such visual imaging is significantly distinguished from prior data recording where image contrast is relatively low and not easily discernable by the human eye with or without high magnification. In cases where laser imaging at wavelengths above 400 nm, based on a thermochromic* change in the polymeric polyacetylenic compound to develop a useful visual image, has been attempted, it has been found that cumbersome high-output equipment, e.g. argon, metal-vapor or gas lasers and the like are required. Relatively low-output lasers, in the 650-1000 nm wavelength range, fail to imprint on either the polyacetylenes or their polymers, particularly in relatively thick layers required to produce useful visual images as opposed to the relatively thin layers needed for digital data recording. Accordingly, it is the aim of research, with consideration to cost performance and production efficiency, to provide an organic system most suitable for visual imaging and optical data recording, which is imageable at an output energy in the 650-1000 nm wavelength range characteristic of compact semi-conductor diode lasers.

* a thermochromic compound is one which undergoes a permanent color change at a specific temperature which is critical to the compound It is an object of this invention to provide a thermochromic medium which is readily imageable by a compact semi-conductor laser, electron beam, and other sources of radiation, in a process which has low cost, high performance and high production efficiency.

Another object of the invention is to provide a laser transmitted image by a low cost high efficiency process.

Still another object of the invention is to provide an instantaneously imageable thermosensitive polyacetylene medium which is receptive to wavelengths up to about 1,500 nm.

Yet another object is to provide a detection system which instantly responds to radiation impingement and imaging on a recording device.

These and other objects of the invention will become apparent from the following description and disclosure.

THE INVENTION

In accordance with this invention there is provided a thermochromic recording medium having a thermal sensitivity above about 50° C., preferably above about 80° C., which comprises an imageable crystalline polyacetylene monomer in contact with imageable polyacetylene polymer particles of the same or different polyacetylene species wherein the mole ratio of said monomer to said polymer is between about 1:1 and about 1000:1, preferably between about 10:1 and about 500:1.

The imageable medium is generally prepared by forming separate dispersions of the polyacetylene monomer and the polyacetylene polymer in a binder and then either adding and mixing the polymer dispersion with the monomer dispersion or forming a separate contiguous film of the polymer dispersion on a surface of the monomer dispersion. The polyacetylene polymer can be applied as a separate layer over or below the monomer layer as a thin film e.g. by the Langmuir-Blodgett deposition technique, by spin coating, spray coating or the like or as a dispersed layer wherein the polymer particles are fixed in a binder.

The imageable medium may also contain an energy absorbing, heat transferring agent having an optical absorption in a wavelength similar to the wavelength of the image transmitting device and, in cases where infrared transmission in the 650 to 1,500 nm wavelength range is desired the incorporation of such an energy absorbing, heat transferring agent is recommended. When employed, said agent is added to at least one of the imageable polyacetylene components in a concentration sufficient to provide a peak optical density of between about 0.1 and about 3, preferably between about 0.2 and about 2.

In accordance with this invention, the polyacetylene monomer is supported on a suitable substrate such as polyethylene, polypropylene, polyvinyl chloride, polyvinylidene chloride, nylon, polyethylene terephthalate, glass, paper, cellophane, cellulose nitrate, cellulose acetate, polystyrene, teflon, polychlorotrifluoroethylene, polycarbonate, glass, ceramic, metal, wood and the like; however, transparent substrates supporting polyacetylene monomer microcrystals dispersed in a binder are preferred. In cases where separate layers of monomer and polymer are employed as the imageable medium, the dispersed monomer forms a layer on the substrate having a thickness of from about 0.1 to about 5 um and said dispersed polymer particles forms a layer over the monomer layer having a thickness of from about 0.02 to about 1 um which is sufficient to provide a desired peak optical density of between about 0.1 and about 3, preferably between about 0.2 and 2. Alternatively the dispersed polymer can be disposed below the monomer as a separate layer between the monomer and the support.

The crystalline polyacetylene monomers employed herein are those having the formula $R\text{-}(C\equiv C)_n\text{-}R'$ wherein n has a value of 2 to 5; R is a polar hydrophilic moiety which promotes hydrogen bonding and which contains an amino, amido, hydroxy, ester, ether, phenol, carboxy, halo, sulfonyl, sulfoxy, sulfinyl, silyl, silyoxy, phosphoro, phosphate, keto, carbonate, aldehyde, urea, urethane radical and a metal salt group and R' is selected from the group of hydrogen, alkyl, aryl, alkaryl, aralkyl and any of the groups defined for R. Generally, the polyacetylene monomers of this invention include any of the known crystalline polyacetylenes which are capable of thermochromic changes, for example, those disclosed in U.S. Pat. Nos. 3,501,303; 4,215,208 and 4,784,934, incorporated herein by reference. Of this group 0.02 um to 1 um microcrystals of the diacetylene monomers containing carboxyl, urea, urethane, ether and carbamate substitution are preferred.

Specific examples of suitable polyacetylenic monomers include
1,6-diamino-1,6-hexadiyne,
2,4-hexadiyn-1,6-bis(n-butyl carbamate),
2,4-hexadiyn-1,6-bis(cyclohexyl urea),
1,12-(3,10-dioxa-5,7-dodecadiyndiyl) dibenzoate,
2,5-octadiyn-1,8-bis(n-propyl carbamate),
3,5-octadiyn-1,8-bis(n-propyl carbamate),
5,7-dodecadiyn-1,12-bis(isopropyl carbamate),
5,7-dodecadiyn-1,12-bis(n-butyl carbamate),
2,4-hexadiyn-1,6-bis(n-propyl urea),
2,4-hexadiyn-1,6-bis(n-octadecyl urea),
1,12-dodecadiynediol,
1,20-diethylhydroxy cosadiyne,
4,6-decadiyn-1,10-bis(naphthanyl carbamate),
2,4-hexadiyn-1,6-bis(isopropyl carbamate),
1,10-di(hydroxyphenyl) decadiyne,
10,12-pentacosadiynoic acid,
4,6-decadiynoic acid,
11,13-tetracosadiynoic acid,
10,12-docosadiynoic acid,
the mono- and di- alkyl esters and dibenzyl esters of the foregoing acids; salts of the foregoing acids and any polymer of the crystalline polyacetylenes or polyacetylene derivatives disclosed in U.S. Pat. Nos. 3,501,303; 4,215,208, and 4,784,934, and those disclosed in copending U.S. patent applications FDN-1889, Ser. No. 601,533, entitled PERMANENT YELLOW IMAGED LIGHT MODULATING FILM and FDN-1871, Ser. No. 601,499, entitled DIACETYLENE ETHERS both filed concurrently herewith and all incorporated herein by reference as well as polymers of triynes, tetraynes and higher polynes and their derivatives and related compounds.

The imageable polyacetylene polymers of this invention are thermochromic homopolymers derived from one of the above polyacetylene monomers by exposure to short wavelength radiation.

Preferred of this group are the thermochromic polyacetylene homopolymers of diacetylenes. The poly(diacetylene) contains repeating units of

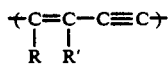

wherein R and R' are as defined above.

The polyacetylene polymer employed in the imageable medium can be a homopolymer of the same species as the monomer or a homopolymer derived from a different species within the scope of polyacetylene monomers defined above. As is well known, the polyacetylene homopolymers of this invention are readily prepared from a corresponding monomer by exposure to ionizing radiation from a source of energy such as UV light, X-ray, gamma-ray, electron beam, etc. It is to be understood that mixtures of polyacetylene monomer and mixtures of the polyacetylene polymer can also be employed as the imageable medium of this invention.

The energy absorbing heat transferring agents of the present invention are dyes having a wide absorption range and include the polycarbocyanine dyes disclosed in my copending patent application FDN-1838, Ser. No. 601,537, entitled Laser Imageable Composition, filed concurrently herewith, and incorporated herein by reference, squarylium dyes and others including energy absorbing metal complex dyes such as for example diimine iron complex, dithiol nickel complex, the dyes of indigo, anthraquinone, azulenium, indolizinium, naphthalocyanine, naphthoquinone and its analogs, phthalocyanine, polymethine, pyrylium, thiapyrylium, telluropyrylium, triaryl ammonium, triquinocycloalkane, and any of the specific dyes disclosed in the Journal of Imaging Science, Volume 32, number 2, March/April 1988, pages 51-56 (ORGANIC ACTIVE LAYER MATERIALS FOR OPTICAL RECORDING by James E. Kuder); Chemistry in Britain, November 1986, pages 997-1000, entitled MODERN DYE CHEMISTRY by J. Griffiths; Angewandte Chemie, Volume 28, number 6, June 1989, pages 677-828 (SEARCH FOR HIGHLY COLORED ORGANIC COMPOUNDS by Jurgen Fabian et al.); JOURNAL OF IMAGING TECHNOLOGY, Volume 12, Number 3, June 1986, pages 140-143, (ORGANIC MATERIALS FOR OPTICAL DATA STORAGE MEDIA—AN OVERVIEW by James E. Kuder), and Kirk-Othmer Encyclopedia of Chemical Technology, Second Edition, Vol. 6, pages 605-609 and 611-624, all incorporated herein by reference. Preferred of this group are dyes or mixtures of said dyes which are water soluble.

The following Table is presented as a guide to the selection of the energy absorbing, heat transferring agent, but is in no way limiting to the scope of suitable dye or dye mixtures which may be employed in the imageable media of this invention.

TABLE

| Dye | Wavelength Absorption |
|---|---|
| Aromatic annulenes | 768 nm |
| Al tetraazaporphyrins | 1204 nm |
| Ni dithiolenes | 1298 nm |
| Streptopolymethines | 1500 nm |
| Silenoxanthenylium | 802 nm |
| Azo | 778 nm |
| Indophenols and Analogues | 761 nm |
| Thermochromic dianthrone | 675 nm |
| Betaines | 934 nm |
| Divinyl benzothiazole | 640 nm |
| Trivinyl benzothiazole | 750 nm |
| Diethyl carbocyanine iodide | 700 nm |

It is to be understood that mixtures of the above dye heat transferring agents can be employed to provide a precise optical absorption between the peak absorptions of the individual dyes and thus are adapted to provide the exact heat transference suited to the wavelength of the laser or light exposure source and the thermosensitivity of the thermochromic polyacetylene monomer and polymer combination selected.

Dispersions of the imageable medium are prepared under atmospheric conditions by forming an emulsion, suspension or dispersion, preferably an aqueous dispersion containing a binder with from about 0.02 um to about 5 um diameter crystals, preferably from 0.1 um to 1.0 um diameter crystals of the polyacetylene monomer and with polyacetylene polymer particles of 0.1 to 1.0 diameter to provide substrate coating layers containing from about 1 to about 90 wt. %, preferably from about 25 to about 75 wt. % polyacetylene solids in the dried coating.

Exemplary of binder materials are natural and synthetic plastics, resins, waxes, colloids, gels and the like including gelatins, desirably photographic-grade gelatin, various polysaccharides including dextran, dextrin, hydrophilic cellulose ethers and esters acetylated starches, natural and synthetic waxes including paraffin, beeswax, polyvinyl-lactams, polymers of acrylic and methacrylic esters and amides, hydrolyzed interpolymers of vinyl acetate and unsaturated addition polymerizable compounds such as maleic anhydride, acrylic and methylacrylic esters and styrene, vinyl acetate polymers and copolymers and their derivatives including completely and partially hydrolyzed products thereof, polyvinyl acetate, polyvinyl alcohol, polyethylene oxide polymers, polyvinylpyrrolidone polyvinyl acetals including polyvinyl acetaldehyde acetal, polyvinyl butyraldehyde acetal, polyvinyl sodium-o-sulfobenzaldehyde acetal, polyvinyl formaldehyde acetal, and numerous other known photographic binder materials including a substantial number of aforelisted useful plastic and resinous substrate materials which are capable of being placed in the form of a dope, solution, dispersion, gel, or the like for incorporation therein of the thermosensitive polyacetylenic compound and capable of processing to a solid form containing dispersed crystals of the thermosensitive crystalline polyacetylenic compound. Preferable, are those binders that can be applied from an aqueous medium, as a dispersion, emulsion or solution and particularly preferable are water soluble binder materials. As is well known in the art in the preparation of smooth uniform continuous coatings of binder materials, there may be employed therewith small amounts of conventional coating aids as viscosity controlling agents, surface active agents, leveling agents dispersing agents and the like. Binder solutions, in the absence of any polyacetylene component, can also be applied as a separate surface coating on the recording film to provide protection against abrasion, moisture, etc.

When employed, the present energy absorbing, heat transferring dye can be incorporated in the imaging medium by various procedures. For example, the dye can be added to one or both of the polyacetylene dispersions, it can be added to the mixed dispersion of monomer and polymer it can be added to a non-dispersed polymer monolayer or it can form a separate layer of the imageable recording medium. In such cases, the dye is employed in an amount sufficient to provide a peak optical density of between about 0.1 and about 3, preferably between about 0.2 and about 2. In cases where the dye is not water soluble and aqueous dispersions of the monomer and polymer are involved, the dye can be dissolved in a suitable inert solvent such as a ketone, benzene, alcohol, and the like for addition to the monomer and/or polymer dispersion. Generally, the weight ratio of polyacetylene monomer to dye in the resulting imageable medium can vary in an extremely wide range, e.g. from about 10,000:1 to about 1:10 depending on the components involved.

The monomer/polymer dispersion is applied to the substrate and dried thereon to provide a recording film wherein the monomer and polymer particles are fixed. Alternatively, the monomer can be applied separately to the substrate and the polymer layer can be subsequently deposited as a separate surface layer before or after drying of the monomer layer. Another alternative involves initially coating the substrate with the polymer and subsequently coating the polymer with the monomer layer. The monomer layer is then optionally coated with a final polyacetylene polymer layer of the same or different species as the monomer subsurface. The polymer and/or monomer can also be applied as one or more mono-molecular layers as formed by the Langmuir-Blodgett technique, spin or spray coating methods.

The dried imageable medium is then exposed to light emanations which impinge and generate heat on the film surface in areas of a predetermined design consistent with a desired pattern to create a color change in the colored polyacetylene polymer portion; and a corresponding latent image in the polyacetylene monomer portion of the medium. In cases where the polymer portion fails to absorb energy in the wavelength of the light emission, a dye of the above described group having an optical absorbance in the wavelength transmission of the imaging device is incorporated therein so as to generate the heat necessary to activate the polymer and to deactivate the monomer in the exposed areas, i.e. presumably, to cause the original crystalline phase of the monomer to become an amorphous phase.

The imaged medium is then subjected to an overall exposure of short-wave radiation generated from a source such as UV light, electron beam, gamma-ray, X-ray, beta-ray, neutrons, alpha-particles and the like to convert the unexposed area of the monomer portion to a color or color intensity which is readily distinguishable from the color of the portion to which the image is transmitted.

It is desirable, for example, when recording visual images for use as master artwork in the graphic arts or printed circuit board industries, to select a polyacetylenic compound which, when subjected to short wavelength radiation, undergoes a thermochromic change dramatically altering the absorption of blue light (e.g. a blue to yellow thermochromic change) since this change will provide the highest contrast for duplication to other recording photosensitive recording media, particularly those containing photopolymers, sensitive to blue and ultraviolet light as are commonly employed in commercial photolithographic printing plates and etch resists used in the preparation of printed board circuits. However, polyacetylenes which are converted to other hues or hue intensities in the red, magenta, green, brown, blue and other color spectra all provide good image definition.

The types of laser which are suitably employed with the present composition include compact semi-conductor, solid state, gas, metal-vapor, UV, and dye lasers. However, semi-conductor diode lasers or solid state lasers are preferred and semi-conductor diode lasers are most preferred. Similar light sources, such as a zenon arc lamp, a mercury arc lamp, a tungsten-quartz halogen lamp and the like, can be substituted for laser imaging devices in the present invention.

The techniques of short wavelength exposure to develop the latent image are well known, thus further amplification is not required. However, for illustrative purposes, it is preferable to choose an exposure source capable of supplying high power to the imageable layer and to employ exposures of between about 1 uJ/cm$^2$ to about 10 J/cm$^2$.

In order to insure the effectiveness of the imaging operation, a detector can be deployed. Suitable types include thermopile, colorimeter, and pyroelectric detectors which have a spectral response between about 200 and 5,000 nm and a power rating of from $7 \times 10^{-9}$ to 200 watts.

Having thus described the invention, reference is now had to the following examples which illustrate preferred embodiments but which are not to be construed as limiting to the scope of the invention which is more broadly defined above and in the appended claims.

EXAMPLE 1

Pentacosa-10,12-diynoic acid (50 g.) is dissolved in 150 g. of ethyl acetate at 50° C. and filtered to provide Solution A. Solution B is prepared by dissolving 50 g. of photographic gelatin and 2 gm of Alkanol XC[(1)] in 900 ml of deionized water at 50° C.

(1) isopropyl naphthalene sulfonate supplied by E. I. duPont

While stirring Solution B at 50° C. in a high intensity mixer, Solution A is added over a 2 minute period, after which agitation is maintained for an additional 2 minutes. The resulting emulsion is then chill set at 4° C. and vacuum dried to about 20% weight loss to remove the ethyl acetate. The dispersion thus formed is melted and reconstituted to form Dispersion A by adding distilled water to replace the liquid lost during vacuum drying.

EXAMPLE 2

Dispersion B is made in a similar way to Dispersion A of Example 1 except that 2,4-hexadiyn-1,6-bisethylcarbamate replaces the pentacosa-10,12-diynoic acid.

EXAMPLE 3

Dispersion C is made by exposing a portion of Dispersion A to 10 MRad of $Co^{60}$ radiation, so as to develop a deep blue color.

EXAMPLE 4

Another portion of Dispersion A (5 g.) with 0.1 ml of a coating aid[(2)] is melted at 40° C. and coated on 4 mil polyester film base to yield a dry coating approximately 2.5 um thick (designated as Coating A). By making a second coating of Dispersion A, 0.25 um thick and further exposing the latter coating to ultraviolet radiation at 254 nm, the pentacosa-10,12-diynoic acid is polymerized to provide a deep blue colored coating, designated as Coating B.

(2) nonylphenol-glycidol copolymer surfactant

EXAMPLE 5

Coatings C and D were prepared in a manner similar to Coatings A and B respectively except that 0.1 gm of dye IR-125[(1)] was added to Dispersion A prior to the coating operation.

(1) cardio green, 1H-benz(e) indolium 2-[7-(1,3-dihydro-1,1-dimethyl-3-(4-sulfobutyl)-2H-benz(e) indol-2- yidene-1,3,5-heptatrienyl]dimethyl-3-(4-sulfobutyl) hydroxide inner salt, sodium salt, supplied by Eastman Kodak Company

EXAMPLE 6

Dispersion C was melted, a small portion of coating aid was added and the resulting material coated to provide a dry layer of 0.25 um thickness over Coating A. This product was designated as Coating E. Similarly, Coatings F, G and H were prepared from coatings B, C and D respectively.

EXAMPLE 7

Dispersion A (25 g.) was mixed with 2 gm of dispersion C and a small portion of coating aid was added together with 0.25 g. of dye IR-125 before coating a 2 um (dry thickness) layer on 4 mil polyester film base, to provide Coating I.

EXAMPLE 8

With the addition of a small amount of coating aid, Dispersion B was coated on a 4 mil polyester base to yield a dry thickness of about 1 um, following which the coating was exposed to ultraviolet radiation at 254 nm sufficient to turn the coating a deep orange-yellow with an optical density of about 2.0. this sample was then over-coated with Dispersion A to an additional dry thickness of 5 um and the product designated as Coating J.

EXAMPLE 9

Coating K is prepared in a similar manner to Coating J of Example 8, except that prior to overcoating, IR-125 dye was added to Dispersion A in the proportion 0.1 gm of IR-125 per 100 g. of Dispersion A.

EXAMPLE 10

Dispersion B (25 g.) and 0.25 gm of Dispersion C were mixed, melted at 40° C. and 0.2 g. of IR-125 dye was added and dissolved therein. After addition of a small amount of coating aid the mixed dispersion was coated on 4 mil polyester base to yield a coated layer with a dry thickness of 4.0 um and the product designated as Coating L.

EXAMPLE 11

Coatings A to L were exposed to the 830 nm wavelength radiation from a 5 mW GaAlAs laser, focused to a spot size of about 1 um. The beam was scanned across the surface of the samples at a rate of 300 cm/sec, after which the coatings were examined under a microscope and the following observations recorded.

| Coating | Observations |
| --- | --- |
| A | No markings |
| B | No markings |
| C | No markings |
| D | Sharply defined pale orange-red lines |
| E | No markings |
| F | No markings |
| G | Sharply defined pale orange-red lines |
| H | Sharply defined deep orange-red lines |
| I | Sharply defined pale orange-red lines |
| J | No markings |
| K | Sharply defined pale magenta lines |
| L | Sharply defined pale orange-red lines |

This example demonstrates that the presence of the infrared absorbing dye in the coating in combination with a polymerized polyacetylene compound will produce sharply defined, contrasted image areas where exposed to infrared radiation.

EXAMPLE 12

The procedure of Example 11 was repeated except that a 5 mW Ar ion laser was employed with an emanation at 514 nm wavelength. The following results were noted when the samples were inspected under a microscope.

| Coating | Observations |
| --- | --- |
| A | No markings |
| B | Sharply defined pale orange-red lines |
| C | No markings |

| Coating | Observations |
| --- | --- |
| D | Sharply defined pale orange-red lines |
| E | Sharply defined pale orange-red lines |
| F | Sharply defined orange-red lines |
| G | Sharply defined pale orange-red lines |
| H | Sharply defined deep orange-red lines |
| I | Sharply defined pale orange-red lines |
| J | No markings |
| K | No markings |
| L | Sharply defined pale orange-red lines |

This example illustrates that markings can be made only when there is present a thermochromic polyacetylene polymer capable of absorbing the laser radiation. The presence of the infrared absorbing dye is of no consequence since it does not absorb the radiation from the Ar ion laser. Coatings J and K produce no markings in this experiment because the yellow polyacetylene polymer contained in them, does not absorb radiation at 514 nm.

EXAMPLE 13

The coated samples from Example 11 were further exposed to ultraviolet radiation at 254 nm with the following findings.

| Coating | Observations |
| --- | --- |
| A | Turns blue, No markings |
| B | Turns blue, No markings |
| C | Turns blue, Sharply defined white lines |
| D | No further changes |
| E | Turns blue, No markings |
| F | Slight overall darkening, No markings |
| G | Turns blue, Sharply defined pale orange-red lines |
| H | No further changes |
| I | Turns blue, Sharply defined pale orange-red lines |
| J | Turns blue, No markings |
| K | Turns blue, Sharply defined pale magenta lines |
| L | Turns darker, Sharply defined pale orange-red lines |

This example shows that when the infrared absorbing dye is present to absorb the laser radiation, it creates a latent image by deactivating the unpolymerized polyacetylene, and this image is revealed by the exposure to UV radiation and subsequent polymerization of the polyacetylene in the non-imaged areas.

However, the original low contrast lines formed by infrared exposure of the Samples of Coatings G, I, K and L from Example 11 are then transformed into high contrast lines by the subsequent UV exposure. The original appearance of these low contrast lines form instantaneously after infrared exposure and can be detected by suitable photodetection means and provide a predictor of the ultimate formation of a high contrast image after application of an overall exposure to UV or other low wavelength radiation.

It is to be understood that the above examples are merely representative and that other imageable polyacetylenes and/or other imageable polyacetylene polymers can be substituted therein with the same or other film bases coated in varying thicknesses to provide similar results. Also, dyes having absorption capability commensurate with the above lasers or other imaging light sources referred to herein can be substituted in Examples 11–13 and other short wavelength radiation devices including an electron beam, γ-rays, X-rays, etc. can be substituted in Example 13 to provide similar results.

What is claimed is:

1. A supported film for thermal recording having a crystalline imageable component which consists essentially of a layer of imageable polyacetylene monomer crystalline particles in contact with separate and discrete crystalline particles of an imageable polyacetylene polymer, wherein the mole ratio of monomer to polymer is between about 1:1 and about 1000:1.

2. The recording film of claim 1 wherein the layer of said monomer is overcoated or undercoated with a separate and contiguous layer of said polymer.

3. The recording film of claim 1 wherein particles of said monomer and said polymer are mixed and contained within the same layer.

4. The recording film of claim 1 wherein particles of said monomer and said polymer are dispersed within a binder.

5. The recording film of claim 2 wherein said monomer is dispersed in a binder and forms a layer on the substrate having a thickness of from about 0.1 to about 5 um and said polymer particles are dispersed in a binder and said polymer dispersion forms a layer over the monomer layer having a thickness of from about 0.02 to about 1.0 um.

6. The recording film of claim 3 wherein said monomer and said polymer in a ratio of about 100:1 to 1:1 are dispersed in a binder and said dispersion is coated in a layer having a thickness of from about 0.02 um to about 5.0 um.

7. The recording film of claim 1 wherein said polyacetylene monomer has the formula $$R_1 \text{+} C \equiv C \text{]}_n R_2$$

wherein n has a value of from 2 to 5, $R_1$ is a polar hydrophilic moiety which promotes hydrogen bonding and which contains a radical selected from the group of urea, urethane, carboxyl, carbamyl, amino, amido, ether, ester, carbamate, hydroxy, or any combination of said radicals and $R_2$ is hydrogen, alkyl or any of the radicals selected from the group of $R_1$ and said polyacetylene polymer is a homopolymer derived from any of the above defined polyacetylene monomers.

8. The recording film of claim 1 wherein said polyacetylene monomer is a diacetylene.

9. The recording film of claim 1 wherein said polyacetylene monomer is 10,12-pentacosadiynoic acid.

10. The recording film of claim 1 wherein said polyacetylene monomer is a substituted diacetylene containing urethanyl and ether substituent radicals.

11. The recording film of claim 1 wherein said polyacetylene monomer is a urethanyl substituted diacetylene.

12. The recording film of claim 1 wherein said polyacetylene monomer is a urea substituted diacetylene.

13. The recording film of claim 1 wherein said polyacetylene monomer is a hydroxyalkylene alkylether substituted diacetylene.

14. The recording film of claim 1 wherein said polyacetylene monomer is an alkylether phenyl ester substituted diacetylene.

15. The recording film of claim 1 wherein said polyacetylene monomer and said polyacetylene polymer are thermochromic compounds having a thermal sensitivity at a temperature of at least 50° C.

16. The recording film of claim 1 wherein an energy absorbing, heat transferring compound capable of absorbing energy transmitted in the wavelength of from about 400 to about 1,500 nm is added to at least one of said imageable polyacetylene components.

17. The recording film of claim 16 wherein said energy absorbing, heat transferring compound is a dye which absorbs energy transmitted in the wavelength of up to about 1,500 nm.

18. The recording film of claim 16 wherein said energy absorbing, heat transferring compound is a dye which absorbs energy transmitted in the wavelength of from about 650 to about 1,200 nm.

19. The recording film of claim 16 wherein said energy absorbing, heat transferring compound is selected from the group of a polycarbocyanine dye, a squarylium dye, an indolizinum dye, indigo, a naphthol dye and a metal complex dye.

* * * * *